United States Patent
Sim et al.

(10) Patent No.: US 10,538,843 B2
(45) Date of Patent: Jan. 21, 2020

(54) VAPORIZER AND THIN FILM DEPOSITION APPARATUS INCLUDING THE SAME

(71) Applicant: SAMSUNG ELECTRONICS CO., LTD., Suwon-si, Gyeonggi-Do (KR)

(72) Inventors: Hyun-Sik Sim, Suwon-si (KR); Jung-Suk Oh, Yongin-si (KR); Jae-Seok Kim, Suwon-si (KR); Ho-Gon Kim, Hwaseong-si (KR); Jun-Won Lee, Asan-si (KR); Hyuk-Yul Choi, Yongin-si (KR); Hyung-Ho Kim, Hwaseong-si (KR); Sang-Jin Choi, Yongin-si (KR); Heok-Jae Lee, Suwon-si (KR); Dong-Ok Shin, Suwon-si (KR); Jang-Hyoun Youm, Suwon-si (KR); Ichiro Nishikawa, Kyoto (JP); Masanori Terasaka, Kyoto (JP); Masashi Hamada, Kyoto (JP); Tae-Hoon Lee, Seongnam-si (KR)

(73) Assignees: SAMSUNG ELECTRONICS CO., LTD., Suwon-si, Gyeonggi-Do (KR); HORIBA STEC, CO., LTD., Kyoto (JP)

( * ) Notice: Subject to any disclaimer, the term of this patent is extended or adjusted under 35 U.S.C. 154(b) by 426 days.

(21) Appl. No.: 15/385,006

(22) Filed: Dec. 20, 2016

(65) Prior Publication Data
US 2017/0241015 A1    Aug. 24, 2017

(30) Foreign Application Priority Data
Feb. 18, 2016 (KR) .................. 10-2016-0019165

(51) Int. Cl.
*C23C 16/455* (2006.01)
*C23C 16/44* (2006.01)

(52) U.S. Cl.
CPC ........ *C23C 16/4412* (2013.01); *C23C 16/455* (2013.01)

(58) Field of Classification Search
CPC .... C23C 16/44; C23C 16/455; C23C 16/4412
See application file for complete search history.

(56) References Cited

U.S. PATENT DOCUMENTS

| | | | |
|---|---|---|---|
| 5,951,923 A * | 9/1999 | Horie ................. | B01D 1/22 261/112.1 |
| 6,110,283 A | 8/2000 | Yamamuka et al. | |

(Continued)

FOREIGN PATENT DOCUMENTS

| | | | |
|---|---|---|---|
| CN | 102912319 B | * | 12/2014 |
| JP | 2016-122841 | * | 7/2016 |

(Continued)

OTHER PUBLICATIONS

AIP Conference Proceedings 449, 133 (1998); Patrick J. Smith, and Patricia M. LindCP449, Characterization and Metrology for ULSI Technology: 1998 International Conference. https://doi.org/10.1063/1.56788.*

(Continued)

*Primary Examiner* — Bret P Chen
(74) *Attorney, Agent, or Firm* — F. Chau & Associates, LLC

(57) ABSTRACT

A vaporizer includes a main body including a first body and a second body. The first body has an upper portion narrowing in a direction of a height of the first body and the second body has a cavity in which the first body is positioned. A mixing chamber is between the first and second bodies. The second body includes a carrier gas injection path connected to a carrier gas inlet formed in an upper portion of the mixing chamber. The carrier gas injection path carries a carrier gas. A source material injection path is connected to a source material inlet formed in the mixing chamber. The source (Continued)

material injection path carries a liquid source material. A discharge is connected to an outlet formed in a lower portion of the mixing chamber. A mixed fluid including the carrier gas and the liquid source material is discharged through the discharge path.

20 Claims, 18 Drawing Sheets

(56) References Cited

U.S. PATENT DOCUMENTS

| | | | | |
|---|---|---|---|---|
| 6,332,601 | B1* | 12/2001 | Huston | C23C 16/448 261/142 |
| 7,540,923 | B2 | 6/2009 | Takagi et al. | |
| 8,280,235 | B2 | 10/2012 | Nishikawa et al. | |
| 8,544,828 | B2 | 10/2013 | Miyamoto et al. | |
| 8,741,063 | B2 | 6/2014 | Yamazaki et al. | |
| 8,755,679 | B2* | 6/2014 | Nishikawa | B01F 5/0451 392/386 |
| 8,763,928 | B2 | 7/2014 | Nishikawa et al. | |
| 9,159,548 | B2 | 10/2015 | Okabe et al. | |
| 9,982,341 | B2* | 5/2018 | Schoepp | C23C 16/4481 |
| 2005/0147749 | A1* | 7/2005 | Liu | B01B 1/005 427/248.1 |
| 2006/0035470 | A1* | 2/2006 | Horii | C23C 16/405 438/758 |
| 2006/0037539 | A1* | 2/2006 | Toda | C23C 16/40 118/726 |
| 2006/0174920 | A1 | 8/2006 | Randhawa | |
| 2006/0278166 | A1 | 12/2006 | Yamoto et al. | |
| 2009/0000740 | A1* | 1/2009 | Kojima | C23C 16/18 156/345.33 |
| 2010/0022097 | A1* | 1/2010 | Yamoto | C23C 16/4481 438/758 |
| 2014/0124064 | A1 | 5/2014 | Hidaka et al. | |
| 2015/0316208 | A1* | 11/2015 | Bae | B63H 21/38 62/53.2 |
| 2018/0308707 | A1* | 10/2018 | Yamaguchi | H01L 21/31122 |

FOREIGN PATENT DOCUMENTS

| | | | |
|---|---|---|---|
| KR | 10-0443290 | 7/2004 | |
| KR | 10-0455224 | 10/2004 | |
| KR | 10-0616136 | 8/2006 | |
| KR | 1020100093588 | 8/2010 | |
| KR | 10-1058976 | 8/2011 | |
| KR | 1020130134647 | 12/2013 | |
| KR | 1020140094657 | 7/2014 | |
| KR | 10-1431290 | 8/2014 | |
| KR | 10-1483472 | 1/2015 | |
| WO | WO 2007/114474 A1 * | 10/2007 | C23C 16/448 |

OTHER PUBLICATIONS

Boumphrey, Stephen, et al., "Understanding vaporizers". Continuing Education in Anaesthesia, Critical Care & Pain, vol. 11 No. 6, 2011, pp. 199-203.*

O'Brien, Paul, et al., "Developments in CVD Delivery System: A Chemist's Perspective on the Chemical and Physical Interactiosn Between Precursors". Chemical Vapor Deposition, 2002, 8, No. 6, pp. 237-249.*

* cited by examiner

VAPORIZER AND THIN FILM DEPOSITION APPARATUS INCLUDING THE SAME

CROSS-REFERENCE TO RELATED APPLICATION

This application claims priority under 35 U.S.C. § 119 to Korean Patent Application No. 10-2016-0019165, filed on Feb. 18, 2016, in the Korean Intellectual Property Office, the disclosure of which is incorporated by reference herein in its entirety.

TECHNICAL FIELD

Exemplary embodiments of the present inventive concept relate to a vaporizer, and more particularly to a thin film deposition apparatus including the vaporizer.

DISCUSSION OF RELATED ART

An injection type vaporizer, which quickly injects a liquid source material based on a high pressure difference of a carrier gas between an inlet and an outlet, may be used in a semiconductor manufacturing process. In this case, while the liquid source material is injected along with the carrier gas, the volume of the liquid source material may expand relatively rapidly and the pressure of the liquid source material may decline relatively rapidly, and thus, the liquid source material may be vaporized.

SUMMARY

One or more exemplary embodiments of the present inventive concept may include a vaporizer having relatively high vaporization efficiency.

A thin film deposition apparatus according to one or more exemplary embodiments of the present inventive concept may include the vaporizer.

According to an exemplary embodiment of the present inventive concept, a vaporizer includes a main body including a first body and a second body. The first body has an upper portion narrowing in a direction of a height of the first body and the second body has a cavity in which the first body is positioned. A mixing chamber is between the first body and the second body. The second body includes a carrier gas injection path connected to a carrier gas inlet formed in an upper portion of the mixing chamber. The carrier gas injection path carries a carrier gas. A source material injection path is connected to a source material inlet formed in the mixing chamber. The source material injection path carries a liquid source material. A discharge is connected to an outlet formed in a lower portion of the mixing chamber. A mixed fluid including the carrier gas and the liquid source material is discharged through the discharge path.

According to an exemplary embodiment of the present inventive concept, a vaporizer includes a main body including a first body and a second body. The first body has an upper portion narrowing in a height direction and the second body has a cavity in which the first body is positioned. A mixing chamber is between the first body and the second body. A valve unit is connected to the first body. The first body is movably combined with the second body. The second body includes a carrier gas injection path connected to a carrier gas inlet formed in an upper portion of the mixing chamber. The carrier gas injection path carries a carrier gas. A source material injection path is connected to a source material inlet formed in the mixing chamber. The source material injection path carries a liquid source material. A discharge path is connected to an outlet formed in a lower portion of the mixing chamber. A mixed fluid including the carrier gas and the liquid source material is discharged through the discharge path. The valve unit is configured to move the first body to open or close the carrier gas inlet and the source material inlet at substantially the same time.

According to an exemplary embodiment of the present inventive concept, a thin film deposition apparatus includes a chamber and a vaporizer configured to supply a vaporized source material to the chamber. The vaporizer includes a first body having an upper portion narrowing in a height direction of the first body and a second body having a cavity in which the first body is positioned. A mixing chamber is between the first body and the second body. The second body includes a carrier gas injection path connected to a carrier gas inlet formed in an upper portion of the mixing chamber. The carrier gas injection path carries a carrier gas. A source material injection path is connected to a source material inlet formed in the mixing chamber. The source material injection path carries a liquid source material. A discharge path is connected to an outlet formed in a lower portion of the mixing chamber. A mixed fluid including the carrier gas and the liquid source material is discharged through the discharge path.

BRIEF DESCRIPTION OF THE DRAWINGS

The above and other features of the inventive concept will become more apparent by describing in detail exemplary embodiments thereof, with reference to the accompanying drawing, in which.

DETAILED DESCRIPTION OF THE EMBODIMENTS

Exemplary embodiments of the present inventive concept will be described in more detail below with reference to the accompanying drawings, in which exemplary embodiments of the present inventive concept are shown. Exemplary embodiments of the present inventive concept may, however, be embodied in many different forms and should not be construed as limited to the embodiments set forth herein.

A vaporizer and a thin film deposition apparatus that will be described below in more detail may have various configurations. Exemplary configurations of the vaporizer and the thin film deposition apparatus will be described below in more detail, and exemplary embodiments of the present inventive concept are not limited thereto.

Figure 1:
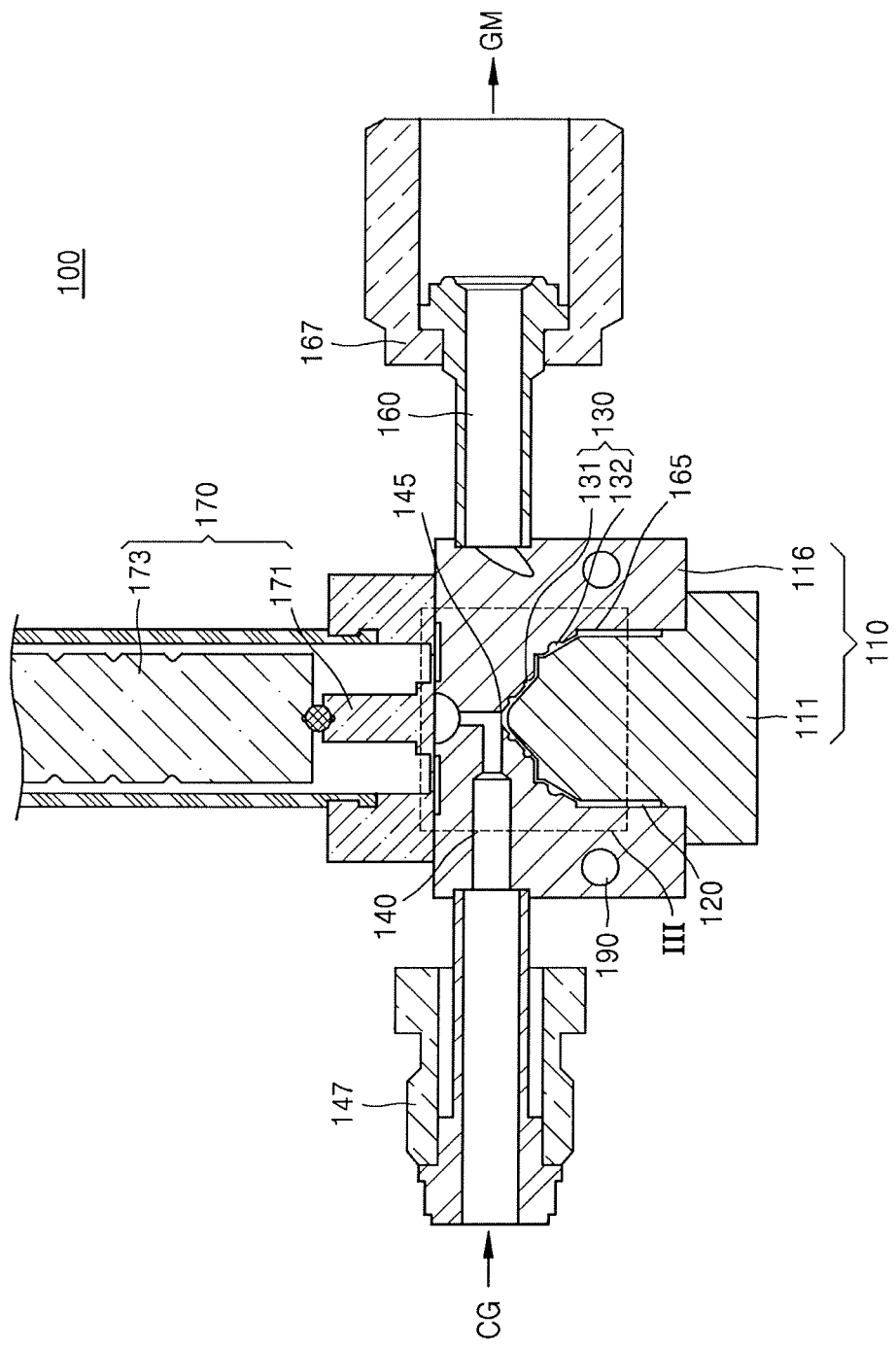
FIGS. 1 and 2 are cross-sectional views illustrating a vaporizer according to an exemplary embodiment of the present inventive concept.
Figure 2:
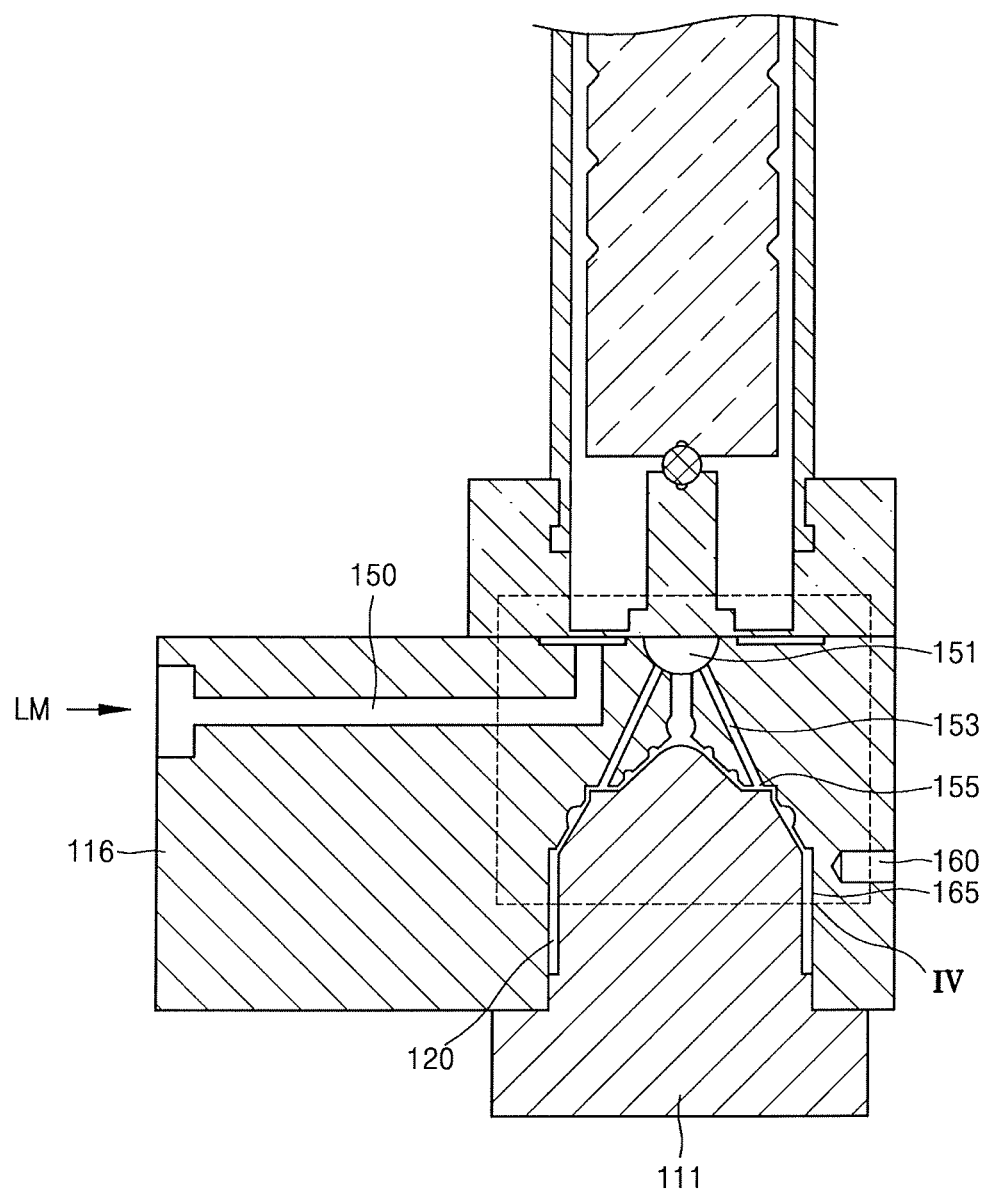
Figure 3:
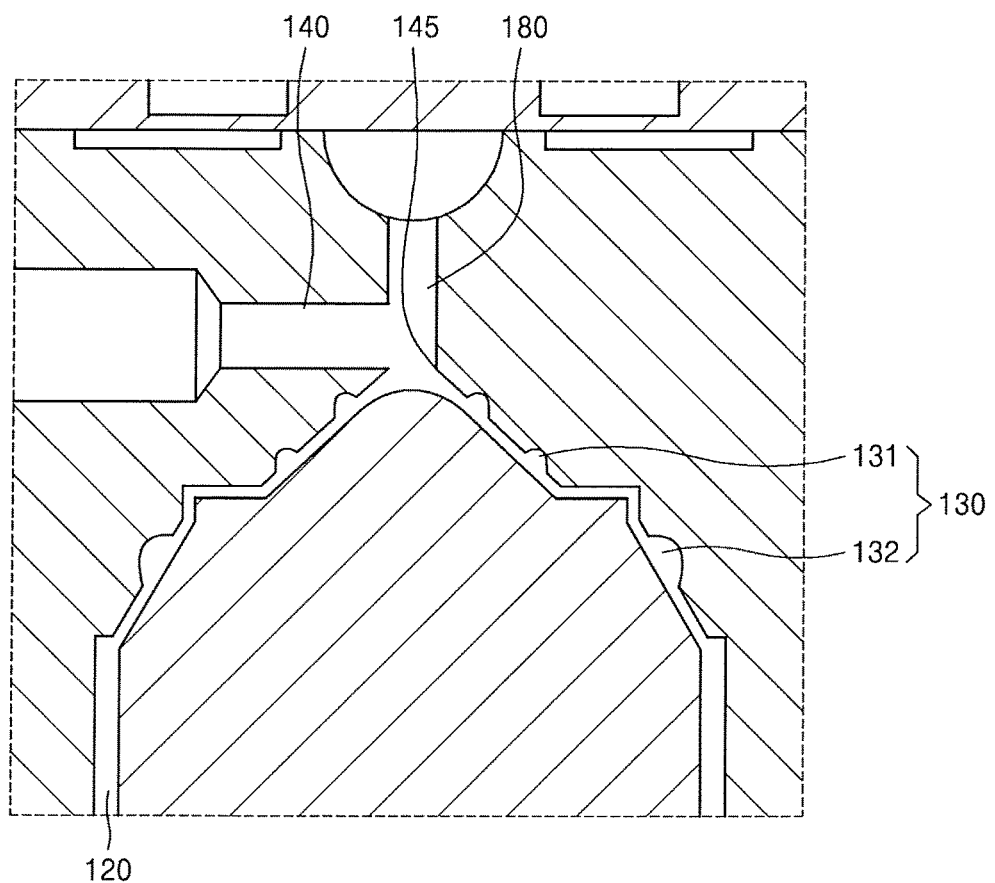
FIG. 3 is a magnified view of an area III of FIG. 1.
Figure 4:
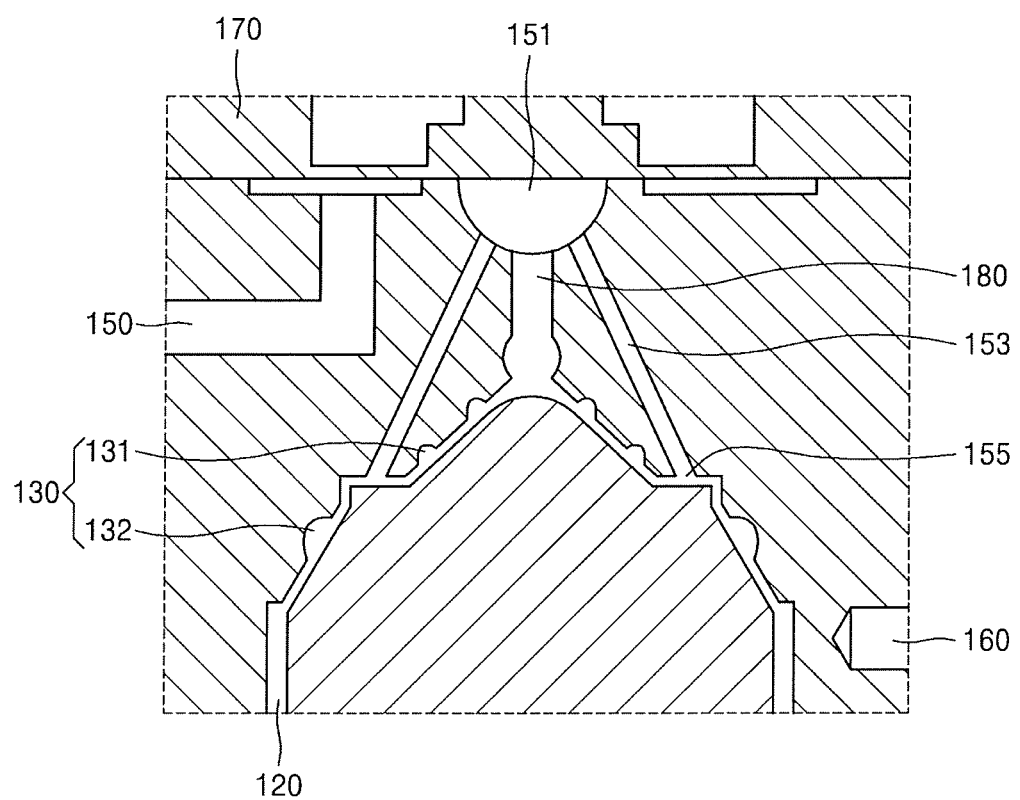
FIG. 4 is a magnified view of an area IV of FIG. 2.

FIGS. 1 and 2 are cross-sectional views illustrating a vaporizer according to an exemplary embodiment of the present inventive concept. FIG. 3 is a magnified view of an area III of FIG. 1. FIG. 4 is a magnified view of an area IV of FIG. 2.

Referring to FIGS. 1 and 2, a vaporizer 100 may include a main body 110 having a mixing chamber 120, a valve unit 170, a carrier gas injection path 140, a source material injection path 150, and a discharge path 160. The carrier gas injection path 140, the source material injection path 150, and the discharge path 160 may be formed in the main body 110. FIGS. 1 and 2 illustrate cross-sectional views of the vaporizer 100 in different directions.

The main body 110 may include the mixing chamber 120 in which a source material and a carrier gas may be mixed with each other. For example, the main body 110 may have a second body 116 with a cavity (for example, a cavity 117 illustrated in FIG. 7) formed in the second body 116. A first body 111 may be disposed in the cavity. A mixing chamber 120 may be disposed in a space between the first body 111 and the second body 116. The mixing chamber 120 may be defined as a space formed between the first body 111 and the second body 116.

The first body 111 may have an upper portion that narrows in a direction of the height of the first body 111. The first body 111 may have a conical shape. The cavity of the second body 116 may have a shape corresponding to the upper portion of the first body 111. Thus, an inner side surface of the second body 116, which may define the cavity, may have a shape corresponding to a shape of the first body 111.

A carrier gas CG may move along the carrier gas injection path 140 and may be injected into the mixing chamber 120 through a carrier gas inlet 145. The carrier gas injection path 140 may be formed in the second body 116. One end of the carrier gas injection path 140 may be connected to a carrier gas supplier that stores and supplies the carrier gas CG, and the other end of the carrier gas injection path 140 may be connected to the carrier gas inlet 145 formed in the mixing chamber 120.

A liquid source material LM may move along the source material injection path 150 and may be injected into the mixing chamber 120 through a source material inlet 155. The source material injection path 150 may be formed in the second body 116. One end of the source material injection path 150 may be connected to a source material supplier that stores and supplies the liquid source material LM, and the other end of the source material injection path 150 may be connected to the source material inlet 155 formed in the mixing chamber 120.

The carrier gas CG injected through the carrier gas injection path 140 and the liquid source material LM injected through the source material injection path 150 may be mixed with each other in the mixing chamber 120. The liquid source material LM may be heated and decompressed in the mixing chamber 120. Thus, the liquid source material LM may be discharged from the vaporizer 100 in a vaporized state. A mixed fluid GM formed by mixture of the liquid source material LM and the carrier gas CG may be discharged through an outlet 165 formed in the mixing chamber 120. The mixed fluid GM may move along the discharge path 160.

A cartridge heater 190 for heating a fluid moving in the mixing chamber 120 may be provided in the main body 110. The cartridge heater 190 may be disposed in a hole formed in the second body 116. The cartridge heater 190 may provide heat for vaporizing the liquid source material LM to the mixing chamber 120.

Referring to FIG. 3, the carrier gas CG transferred along the carrier gas injection path 140 may be injected into the mixing chamber 120 through the carrier gas inlet 145 formed in an upper portion of the mixing chamber 120. In the mixing chamber 120, the carrier gas CG may move along a path extending from the carrier gas inlet 145 to the outlet 165. The carrier gas CG may move along a gap between the first body 111 and the second body 116, and thus, as the carrier gas CG may move to a lower portion of the mixing chamber 120, and the carrier gas CG may be spread over a relatively wide area.

The carrier gas CG injected through the carrier gas inlet 145 may be injected into the mixing chamber 120 in a direction of gravity. Thus, the speed of injection of the carrier gas CG injected through the carrier gas inlet 145 may be determined by gravity.

Referring to FIG. 4, the liquid source material LM transferred along the source material injection path 150 may be supplied to the mixing chamber 120 through a plurality of source material inlets 155 formed in a middle portion of the mixing chamber 120. The source material injection path 150 may include a distribution portion 151 positioned between the second body 116 and the valve unit 170 and two or more spray paths 153 extending from the distribution portion 151 to two or more source material inlets 155.

The source material injection path 150 may have a shower head structure by which a liquid source material may be injected toward a plurality of points of the mixing chamber 120 at substantially the same time. The liquid source material LM supplied to one end of the source material injection path 150 may flow from the distribution portion 151 to two or more spray paths 153, and thus, the liquid source material LM may be sprayed to a plurality of points of the mixing chamber 120 at substantially the same time. The liquid source material LM sprayed through the source material inlets 155 may meet with the carrier gas CG moving from an upper portion of the mixing chamber 120 to a lower portion of the mixing chamber 120. The liquid source material LM may be mixed with the carrier gas CG, and a mixed fluid formed by mixture of the liquid source material LM and the carrier gas CG may move to a lower portion of the mixing chamber 120. The mixed fluid may move along a gap between the first body 111 and the second body 116, and thus, as the mixed fluid moves to a lower portion of the mixing chamber 120, the mixed fluid may be spread over a relatively wide area.

A direction in which each of the spray paths 153 extends may form a predetermined angle (for example, an angle between 10 degrees and 30 degrees) with the direction of gravity. Thus, the speed of the liquid source material LM sprayed through the spray paths 153 may be determined by gravity and the angle of the spray paths 153 with respect to the direction of gravity.

The valve unit 170 that controls the injection of a source material may be installed in the source material injection path 150 through which the source material is transferred. For example, the valve unit 170 may be disposed on the second body 116. In the source material injection path 150, a source material may be injected into the distribution portion 151 through a path formed between an upper surface of the second body 116 and the valve unit 170. The valve unit 170 may control the injection of the source material by opening or closing the path formed between the upper surface of the second body 116 and the valve unit 170.

For example, the valve unit 170 may include a diaphragm 171. The diaphragm 171 may be in contact with the main body 110. An actuator 173 may apply a pressure to the diaphragm 171 to transform the diaphragm 171. When the valve unit 170 opens the source material injection path 150, the main body 110 and the valve unit 170 may be spaced apart from each other by a certain distance. When the valve unit 170 closes the source material injection path 150, the actuator 173 may close a moving path of the source material formed between the upper surface of the second body 116 and the valve unit 170 by applying a pressure to the diaphragm 171. The diaphragm 171 may include a material having heat resistance, corrosion resistance, and elasticity. A sealing member may be positioned in an area in which the valve unit 170 and the main body 110 contact each other.

Referring to FIGS. 3 and 4, the vaporizer 100 may include a purge path 180. The purge path 180 may prevent the source material injection path from being blocked due to solids of a liquid source material flowing along the source material injection path 150. The purge path 180 may connect the carrier gas injection path 140 to the source material injection path 150. Thus, at least some of a carrier gas flowing through the carrier gas injection path 140 may move to the mixing chamber 120 via the source material injection path 150. While a carrier gas passes through the source material injection path 150, solids of a liquid source material, formed in the source material injection path 150, may be removed.

For example, one end of the purge path 180 may be connected to the carrier gas inlet 145 at an area adjacent to the carrier gas inlet 145, and the other end of the purge path 180 may be connected to the distribution path 151 of the source material injection path 150. To purge the source material injection path 150, the valve unit 170 may close the path formed between the upper surface of the main body 110 and the valve unit 170 so that a source material is not injected through the distribution portion 151 and the spray paths 153. When the valve unit 170 closes the source material injection path 150, some of a carrier gas moving along the carrier gas injection path 140 may move to the distribution portion 151 along the purge path 180 and the carrier gas may move to the mixing chamber 120 through the spray paths 153. Thus, the vaporizer 100 including the purge path 180 may reduce or eliminate an occurrence of the source material injection path 150 being blocked due to long-term use of the vaporizer 100. Thus, reliability and lifespan of the vaporizer 100 may be increased.

A groove 130 rotating a carrier gas and/or a source material may be formed in the inner wall of the mixing chamber 120. The groove 130 will be described in more detail below.

Figure 5:
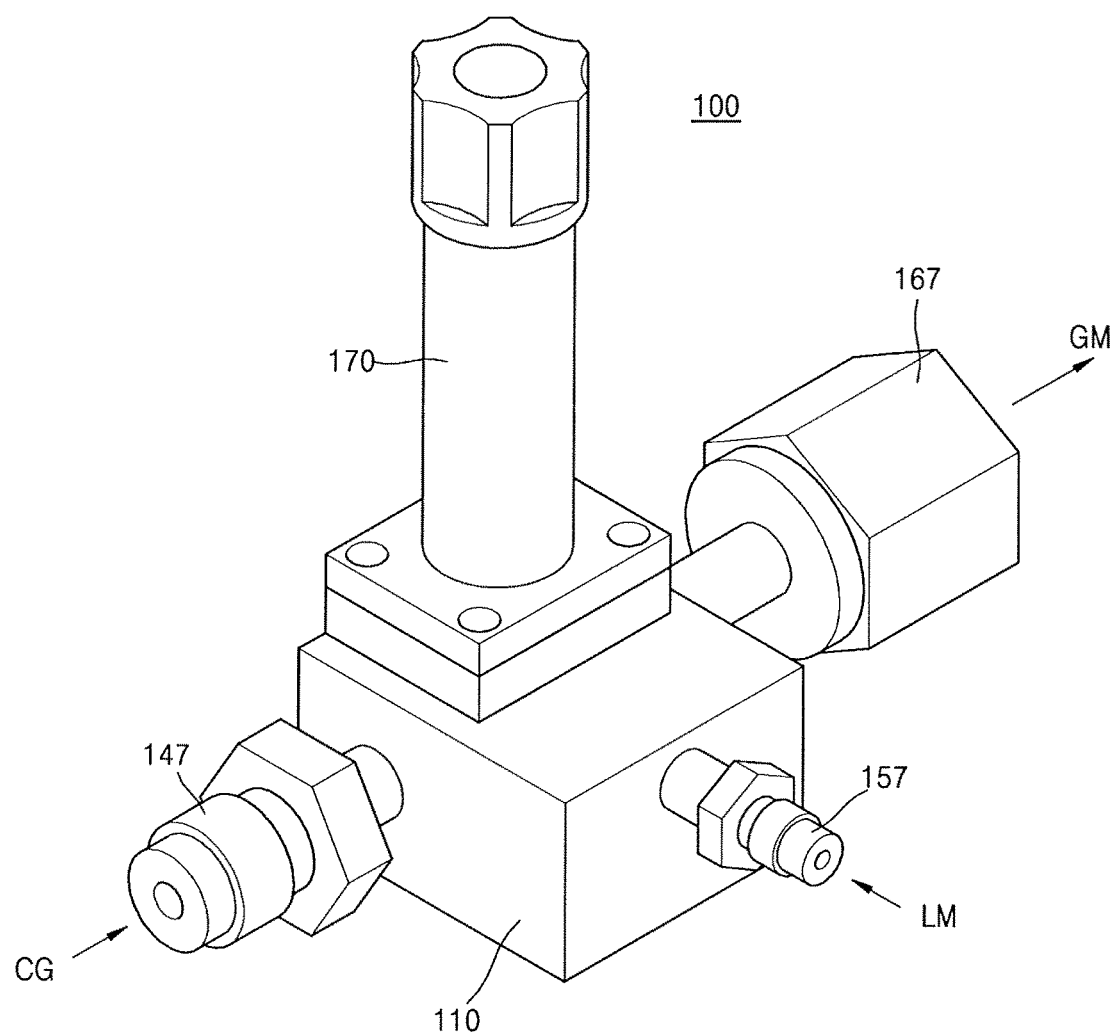
FIG. 5 is a perspective view illustrating the exterior of a vaporizer according to an exemplary embodiment of the present inventive concept.

FIG. 5 is a perspective view illustrating the exterior of a vaporizer according to an exemplary embodiment of the present inventive concept.

Referring to FIG. 5, the vaporizer 100 may include the main body 110 and a carrier gas introduction frame 147, a source material introduction frame 157, a discharge frame 167, and the valve unit 170. The carrier gas introduction frame 147, the source material introduction frame 157, the discharge frame 167, and the valve unit 170 may be connected to the main body 110. For example, the carrier gas introduction frame 147, the source material introduction frame 157, and the discharge frame 167 may be mounted on the side portions of the main body 110. The carrier gas introduction frame 147 and the source material introduction frame 157 may be mounted on sides of the main body 110 that are perpendicular to each other. The discharge frame 167 may be mounted on a side of the main body 110 that is opposite to a side of the main body 110 on which the carrier gas introduction frame 147 is mounted. The valve unit 170 may be mounted on an upper portion of the main body 110.

A carrier gas CG moving along the carrier gas introduction frame 147 and a liquid source material LM moving along the source material introduction frame 157 may be supplied to the main body 110 in directions that are substantially perpendicular to each other. A mixed fluid GM including a vaporized source material may be discharged in a direction substantially parallel to that of the carrier gas CG supplied along the carrier gas introduction frame 147.

Referring to FIGS. 1, 2, and 5, the carrier gas injection path 140 may be connected to a passage formed in the carrier gas introduction frame 147. The source material injection path 150 may be connected to a passage formed in the source material introduction frame 157. The discharge path 160 may be connected to a passage formed in the discharge frame 167.

Figure 6:
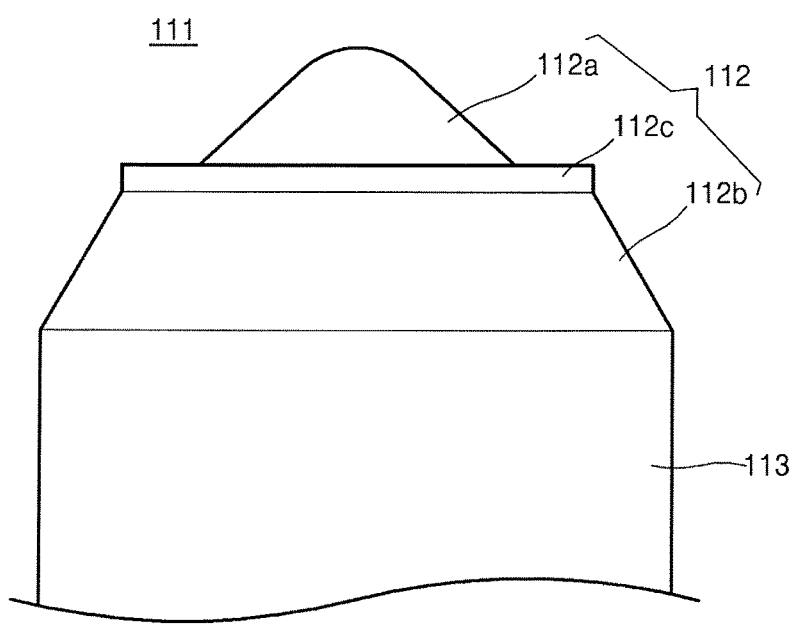
FIG. 6 is a side view illustrating a first body according to an exemplary embodiment of the present inventive concept.
Figure 7:
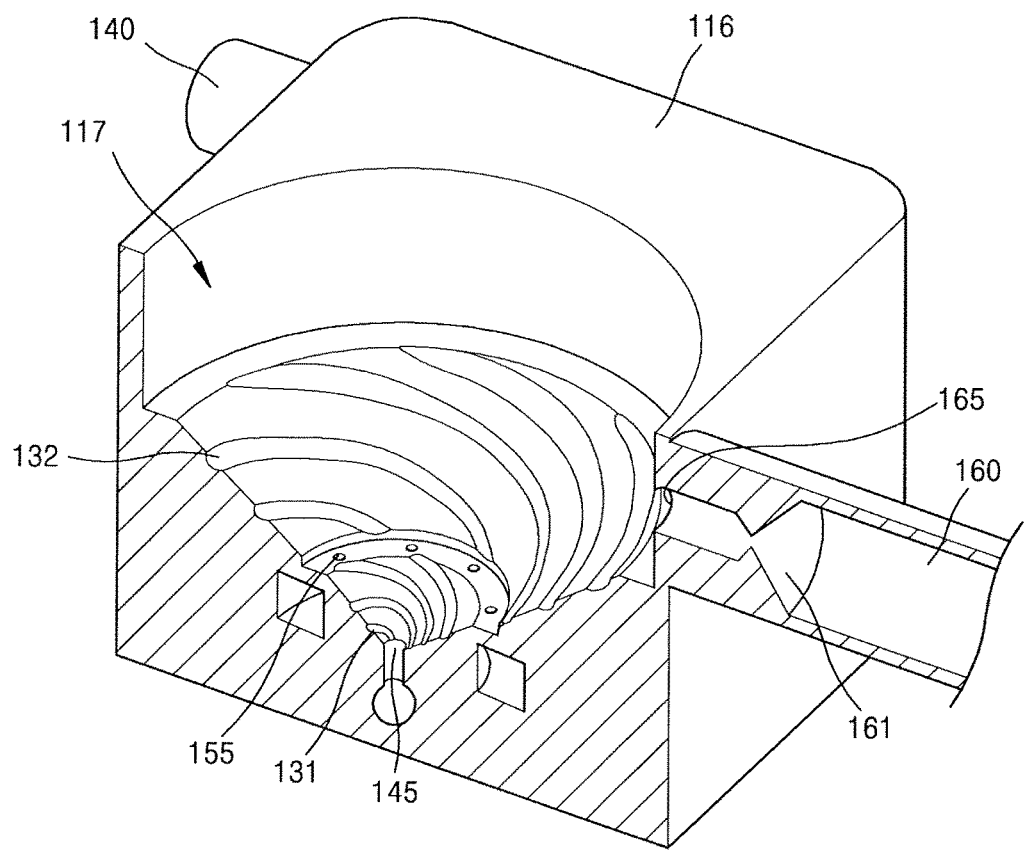
FIG. 7 is a partial perspective view illustrating a second body according to an exemplary embodiment of the present inventive concept.

FIG. 6 is a side view illustrating a first body according to an exemplary embodiment of the present inventive concept. FIG. 7 is a partial perspective view illustrating a second body according to an exemplary embodiment of the present inventive concept.

Referring to FIG. 6 together with FIG. 1, the first body 111 may include an upper portion 112 and a lower portion 113 connected to a lower side of the upper portion 112. The upper portion 112 may have a horizontal section that narrows in a direction of the height of the first body 111. The lower portion 113 may have a horizontal section having an area that is constant in the direction of the height of the first body 111. The horizontal section may be a cross-section obtained by cutting the upper portion 112 or the lower portion 113 in a direction perpendicular to the direction of the height of the first body 111.

The carrier gas inlet 145 may be positioned in an upper side of the upper portion of the first body 111, and a carrier gas injected in the mixing chamber 120 through the carrier gas inlet 145 may move toward a lower portion of the mixing chamber 120 while widely spreading along a surface of the upper portion 112 of the first body 111.

For example, the upper portion 112 may include a first upper portion 112a that has a horizontal cross section widening in a downward direction and is positioned under the carrier gas inlet 145, a third upper portion 112c that is connected to the lower side of the first upper portion 112a and faces the source material inlet 155, and a second upper portion 112b that is connected to a lower side of the third upper portion 112c and has a horizontal cross section broadening in the downward direction. The first upper portion 112a and the second upper portion 112b may be spaced apart from each other with the third upper portion 112c disposed between the first upper portion 112a and the second upper portion 112b.

Referring to FIG. 7 together with FIGS. 1 and 2, the second body 116 may include the cavity 117 in which the first body 111 may be disposed. The cavity 117 may have an end portion narrowing in a direction of the depth of the cavity 117.

The outlet 165, the source material inlet 155, and the carrier gas inlet 145 may be formed in an inner surface of the second body 116. The outlet 165, the source material inlet 155, and the carrier gas inlet 145 may be connected to the cavity 117. The carrier gas inlet 145 may be formed at a highest level of the cavity 117 with respect to a direction of the depth of the cavity 117. The source material inlet 155 may be formed at a level that is lower than that of the carrier gas inlet 145, and the outlet 165 may be formed at a level that is lower than that of the source material inlet 155 and that of the carrier gas inlet 145.

A plurality of source material inlets 155 may be formed. The plurality of source material inlets 155 may be radially spaced apart from each other and may also be substantially equidistantly spaced apart from each other.

The groove 130 having a predetermined width and a predetermined depth may be formed in an inner side surface of the second body 116. The groove 130 may extend in a spiral direction, and a carrier gas and/or a source material, injected into the mixing chamber 120, may be rotated in the spiral direction along the groove 130. The groove 130 may cause the carrier gas and/or the source material to rotate therein.

The farther the groove 130 is from the carrier gas inlet 145, the larger turning radius the groove 130 may have.

A rotational direction of the groove 130 may be a direction in which a Coriolis force increases a rotational speed of a fluid moving along the groove 130, and thus the groove 130 may increase the efficiency of mixing of a carrier gas and a source material due to rotation.

The groove 130 may include a first groove 131, formed in the inner side surface of the second body 116 between the carrier gas inlet 145 and the source material inlet 155, and a second groove 132, formed in the inner side surface of the second body 116 and spaced apart from the first groove 131. The source material inlet 155 may be disposed between the first groove 131 and the second groove 132. Thus, at least some of a carrier gas injected through the carrier gas inlet 145 may rotate along the first groove 131 and may move toward a lower portion of the mixing chamber 120, and a source material injected through the source material inlet 155 may rotate along the second groove 132 along with a carrier gas passing through the first groove 131. The carrier gas and the source material may move toward the lower portion of the mixing chamber 120.

Figure 8:
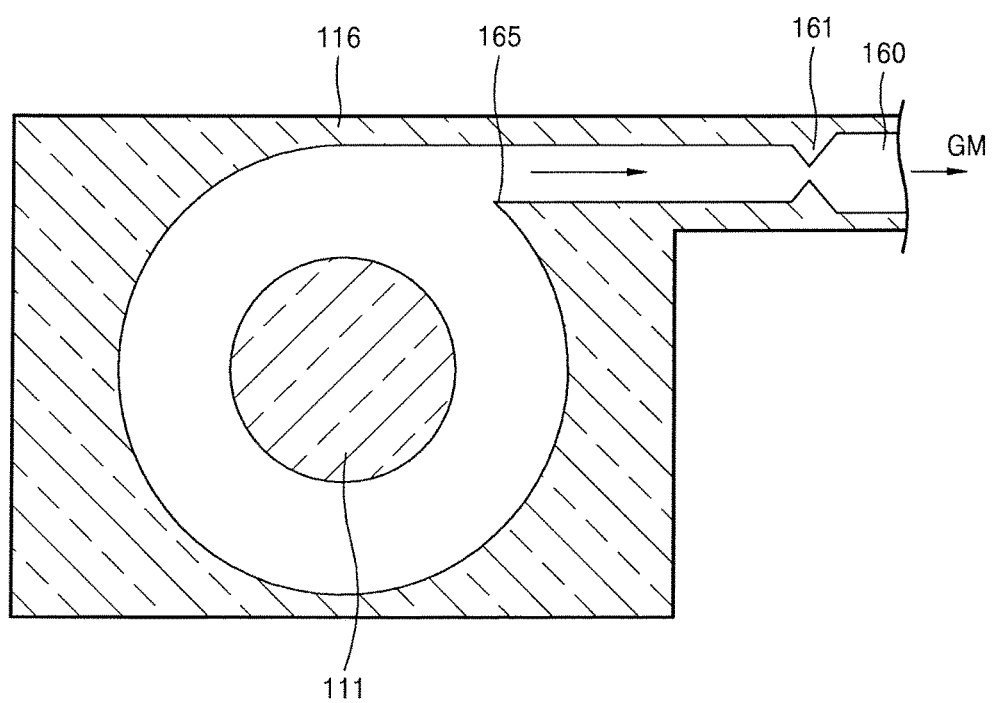
FIG. 8 is a diagram for describing a discharge path according to an exemplary embodiment of the present inventive concept.

FIG. 8 is a diagram for describing the discharge path 160 according to an exemplary embodiment of the present inventive concept.

Referring to FIGS. 1 and 8, the mixed fluid GM may be discharged through the discharge path 160 connected to the outlet 165. The mixed fluid GM may rotate along the groove 130 and move to a lower portion of the mixing chamber 120 and may be discharged through the outlet 165 formed in a lower portion of the mixing chamber 120.

Referring to FIG. 8, the mixed fluid GM rotating along the groove 130 formed in a spiral direction may rotate in a clockwise direction, and the discharge path 160 extending from the outlet 165 may extend in a tangential direction to the spiral direction. The mixed fluid GM may maintain a rotational speed until just before the mixed fluid GM is spayed through the outlet 165, thus increasing a turning effect created by the groove 130.

The orifice portion 161 may be formed in the discharge path 160. The orifice portion 161 may diffuse a source material, which passes through a relatively narrow passage, to a relatively wide passage, and thus, a decompressed source material may be substantially completely vaporized.

Figure 9:
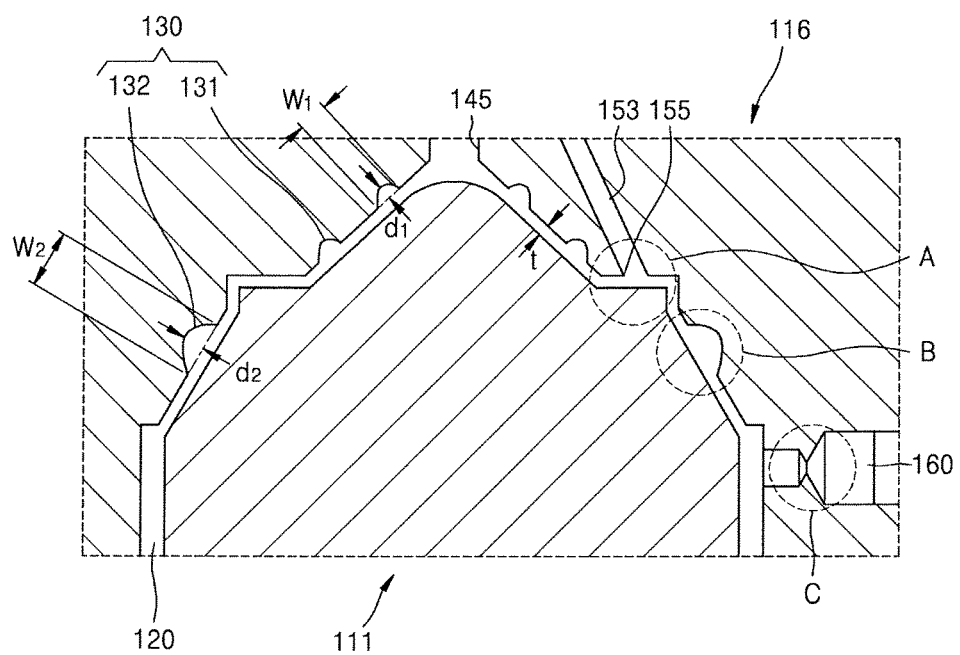
FIG. 9 is a cross-sectional view illustrating a magnified portion of a vaporizer according to an exemplary embodiment of the present inventive concept.
Figure 10:
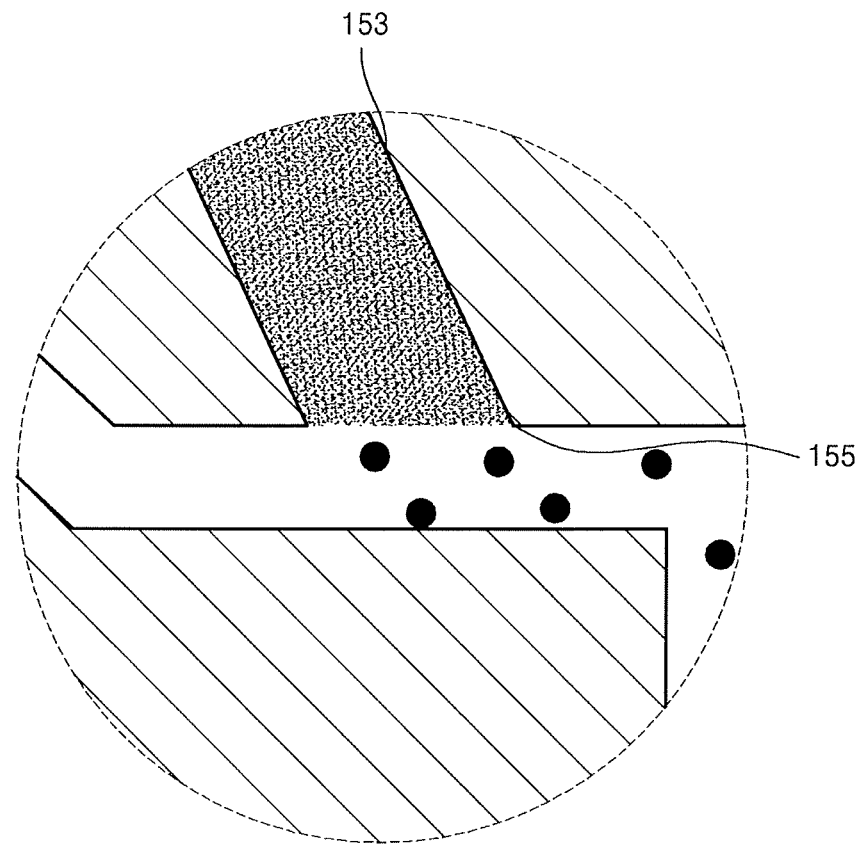
FIG. 10 is a magnified view of an area A of FIG. 9.
Figure 11:
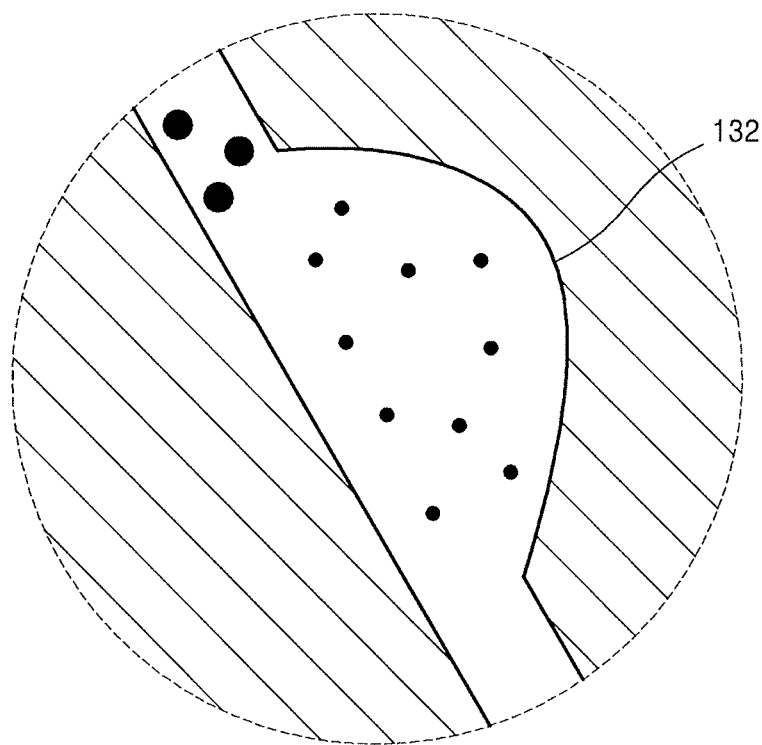
FIG. 11 is a magnified view of an area B of FIG. 9.
Figure 12:
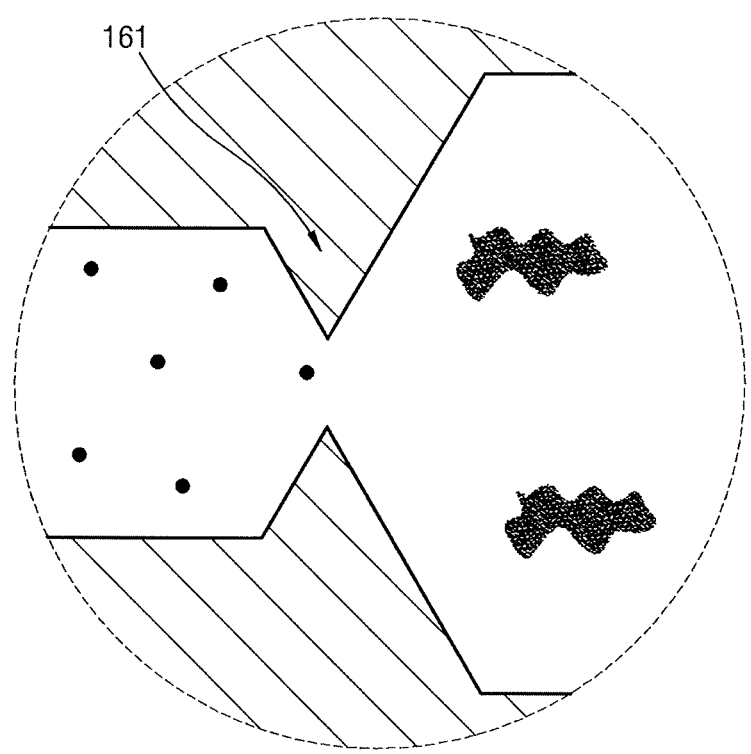
FIG. 12 is a magnified view of an area C of FIG. 9.

FIG. 9 is a cross-sectional view illustrating the magnification of a portion of a vaporizer according to an exemplary embodiment of the present inventive concept. FIG. 10 is a diagram illustrating the magnification of an area A of FIG. 9. FIG. 11 is a diagram illustrating the magnification of an area B of FIG. 9. FIG. 12 is a diagram illustrating the magnification of an area C of FIG. 9.

Referring to FIG. 9, the groove 130 may be formed in an inner side surface of the second body 116, and the groove 130 may include the first groove 131 formed between the carrier gas inlet 145 and the source material inlet 155 and the second groove 132 formed under the source material inlet 155.

A carrier gas may be injected into the top of a first body 111 and may move downward. At least a portion of the carrier gas may rotate along the first groove 131 while filling the first groove 131, and a remaining part of the carrier gas may move downward along a gap between an upper portion of the first body 111 and the inner side surface of the second body 116.

A liquid source material sprayed through the source material inlet 155 may meet the carrier gas moving downward from the top of the first body 111 and may be mixed with the carrier gas. At least a portion of a mixed fluid including the liquid source material and the carrier gas may rotate along the second groove 132 while filling the second groove 132, and another portion of the mixed fluid may move to a lower portion of the mixing chamber 120 through the gap between the upper portion of the first body 111 and the inner side surface of the second body 116.

The mixing chamber 120 may have a shape that allows a carrier gas and a source material to move from an upper portion of the mixing chamber 120 to a lower portion of the mixing chamber 120. Thus, the carrier gas and the source material may be spread over a relatively wide area. Thus, a pressure of the source material may be relatively low in the mixing chamber 120.

The groove 130 may have a predetermined width and a predetermined depth. A width W2 of the second groove 132 may be greater than a width W1 of the first groove 131, and a depth d2 of the second groove 132 may be greater than a depth d1 of the first groove 131.

The groove 130 may be formed so that a width and a depth of the groove gradually increase toward a lower portion of the mixing chamber 120. For example, the width W1 and the depth d1 of the first groove 131 may increase in an extending direction of the first groove 131. The width W2 and the depth d2 of the second groove 132 may increase in an extending direction of the second groove 132.

The depth of the groove 130 may be greater than a distance t between the upper portion of the first body 111 and the inner side surface of the second body 116. Thus, the amount of a fluid moving through the gap between the upper portion of the first body 111 and the inner side surface of the second body 116 may be relatively low, and the amount of a fluid moving while rotating along the groove 130 may be relatively high.

A process in which a liquid source material is vaporized is described in more detail below with reference to FIGS. 9 to 12.

Referring to FIG. 10, a carrier gas injected into an upper portion of the mixing chamber 120 through the carrier gas injection path 140 may move toward a lower portion of the mixing chamber 120 and may be mixed with a liquid source material injected into the mixing chamber 120 through the source material injection path 150. The first groove 131 may rotate the carrier gas relatively rapidly in a spiral direction and thus may split the liquid source material, sprayed through the source material inlet 155 rotating at a relatively high speed, into minute droplets. The liquid source material may collide with a high speed carrier gas and may thus be broken into minute droplets. As the liquid source material is broken into minute droplets, the entire surface area of the source material may increase. Thus, a relatively large amount of heat may be transferred to the source material, and thus, the temperature of the source material may increase and the pressure of the source material may decrease.

Referring to FIGS. 7 and 10, a plurality of source material inlets 155 may be formed, and the source material injection path 150 may inject a liquid source material to a plurality of points of the mixing chamber 120 at substantially the same time through a plurality of spray paths 153 connected to the plurality of source material inlets 155. Thus, the liquid source material may meet with a carrier gas over a relatively wide area. For example, the liquid source material may meet with the carrier gas over a relatively wider area than in a case in which a liquid source material is sprayed through a single path, and thus, the carrier gas and the source material may be more uniformly mixed with each other.

Referring to FIG. 11, the liquid source material may rotate relatively quickly along the second groove 132 after being mixed with the carrier gas. While the liquid source material rotates along the second groove 132, the liquid source material and the carrier gas may be more uniformly mixed with each other.

The second groove 132 may increase the length of a moving path of the liquid source material and thus an effect of lowering the pressure of the liquid source material may be increased and a relatively large amount of heat may be supplied to the liquid source material. Thus, while the liquid source material passes through the second groove 132, at least some of the liquid source material may be vaporized and/or at least some of the liquid source material may be split into relatively small-sized droplets.

Referring to FIG. 12, a mixed fluid including the liquid source material and the carrier gas may be discharged from the mixing chamber 120 through the discharge path 160. While a source material heated by a relatively high temperature passes through an orifice portion 161, the pressure of the source material may be lowered relatively rapidly. Thus, the source material may reach a substantially complete gaseous state after passing through the orifice portion 161.

Figure 13:
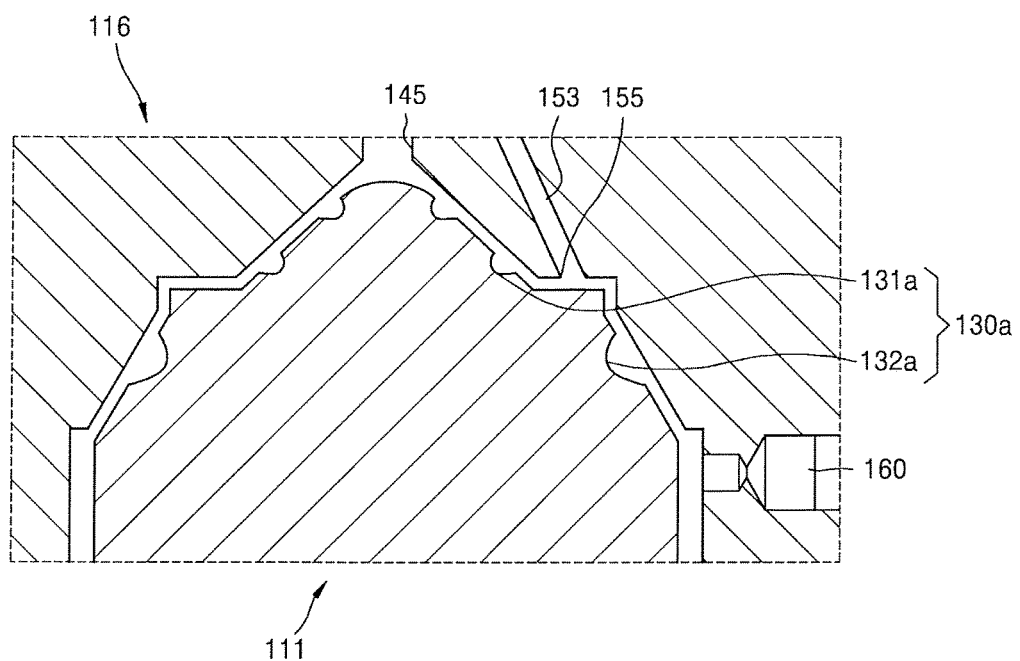
FIG. 13 is a cross-sectional view of a magnified portion of a vaporizer according to an exemplary embodiment of the present inventive concept.

FIG. 13 is a cross-sectional view illustrating the magnification of a portion of a vaporizer according to an exemplary embodiment of the present inventive concept.

Referring to FIG. 13, the vaporizer described with reference to FIG. 13 may have substantially the same structure as the vaporizer 100 described with reference to FIG. 9 except for the position of a groove 130*a*. Thus, duplicative descriptions may be omitted.

Referring to FIG. 13, the groove 130*a* may be formed in an upper portion of the first body 111. The groove 130*a* may include a first groove 131*a* for rotating a carrier gas sprayed from a carrier gas inlet 145 and a second groove 132*a* for rotating both the carrier gas and a source material.

A carrier gas injected toward the top of the first body 111 may fill the first groove 131*a* formed in the upper portion of the first body 111 and may rotate along the first groove 131*a*. A liquid source material sprayed from the source material inlet 155 may be mixed with the carrier gas. At least some portion of a mixed fluid including the liquid source material and the carrier gas may fill the second groove 132*a* formed in the upper portion of the first body 111 and may rotate along the second groove 132*a*.

Figure 14:
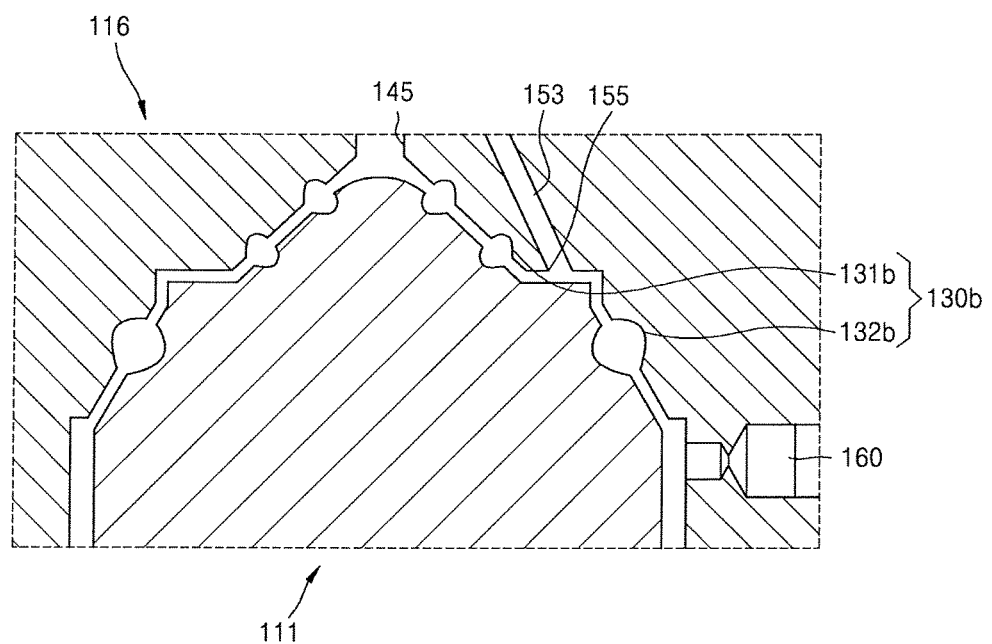
FIG. 14 is a cross-sectional view of a magnified portion of a vaporizer according to an exemplary embodiment of the present inventive concept.

FIG. 14 is a cross-sectional view illustrating the magnification of a portion of a vaporizer according to an exemplary embodiment of the present inventive concept.

Referring to FIG. 14, the vaporizer described with reference to FIG. 14 may have substantially the same structure as the vaporizer 100 described with reference to FIG. 9 except for the position of a groove 130*b*. Thus, duplicative descriptions may be omitted.

Referring to FIG. 14, the groove 130*b* may be formed in both an inner side surface of a second body 116 and an upper portion of a first body 111. A groove 130*b* formed in the upper portion of the first body 111 may be formed to correspond to a groove 130*b* formed in the inner side surface of the second body 116. The groove 130*b* may include a first groove 131*b* for rotating a carrier gas injected from the carrier gas inlet 145 and a second groove 132*b* for rotating both the carrier gas and a source material.

A carrier gas injected toward the top of the first body 111 may fill the first groove 131*b* formed in both the upper portion of the first body 111 and the inner side surface of the second body 116. The carrier gas may rotate along the first groove 131*b*. A liquid source material sprayed from the source material inlet 155 may be mixed with the carrier gas. At least some portion of a mixed fluid including the liquid source material and the carrier gas may fill the second groove 132*b* formed in both the upper portion of the first body 111 and the inner side surface of the second body 116 and may rotate along the second groove 132*b*.

Thus, the first groove 131*b* may rotate a relatively large amount of carrier gas at a relatively high speed. Thus, the liquid source material injected through the source material inlet 155 may be split into minute droplets. Since the second groove 132*b* may rotate a relatively large amount of source material at a relatively high speed, an effect of lowering the pressure of a source material moving along the second groove 132*b* may be increased and a relatively large amount of heat may be supplied to the source material.

Figure 15:
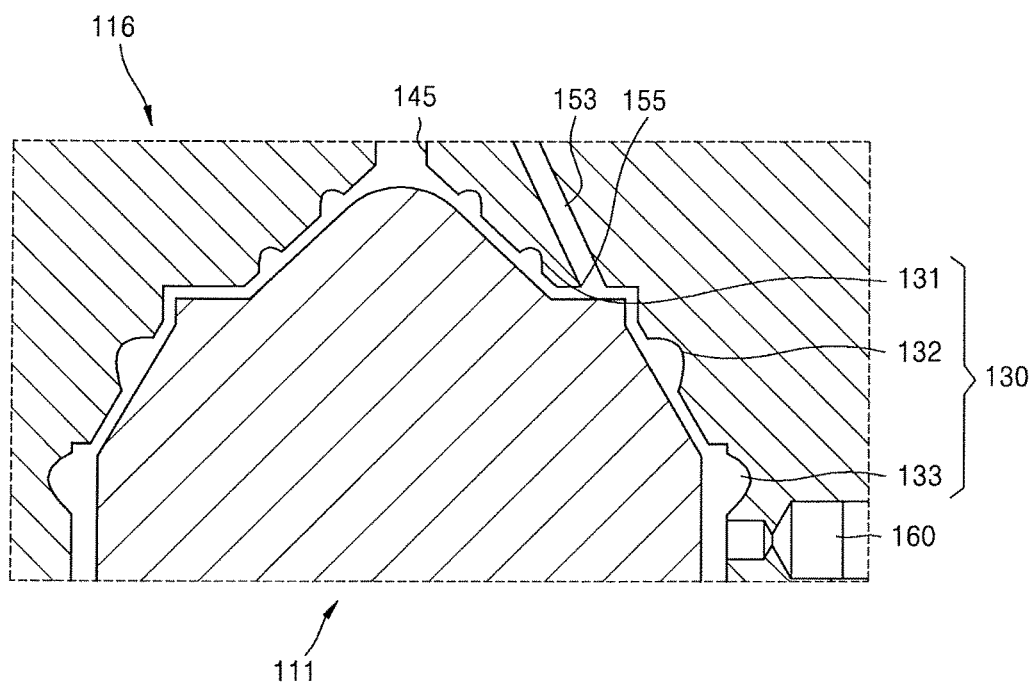
FIG. 15 is a cross-sectional view of a magnified portion of a vaporizer according to an exemplary embodiment of the present inventive concept.

FIG. 15 is a cross-sectional view illustrating the magnification of a portion of a vaporizer according to an exemplary embodiment of the present inventive concept.

Referring to FIG. 15, the vaporizer described with reference to FIG. 15 may have substantially the same structure as the vaporizer 100 described with reference to FIG. 9, except that the vaporizer described with reference to FIG. 15 includes a third groove 133. Thus, duplicative descriptions may be omitted.

Referring FIG. 15 together with FIG. 6, the groove 130 may be formed in the second body 116. The groove 130 may include first and second grooves 131 and 132 formed in a portion of an inner side surface of the second body 116, which faces an upper portion 112 of a first body 111. The third groove 133 may be formed in a portion of the inner side surface of the second body 116, which faces a lower portion 113 of the first body 111. The third groove 133 may have a direction of rotation, which is the same as those of the first and second grooves 131 and 132, and extends in a spiral direction.

The third groove 133 may rotate a mixed fluid until just before the mixed fluid is discharged through an outlet 165, thus increasing an effect of lowering the pressure of a source material and increasing the temperature of the source material.

Figure 16:
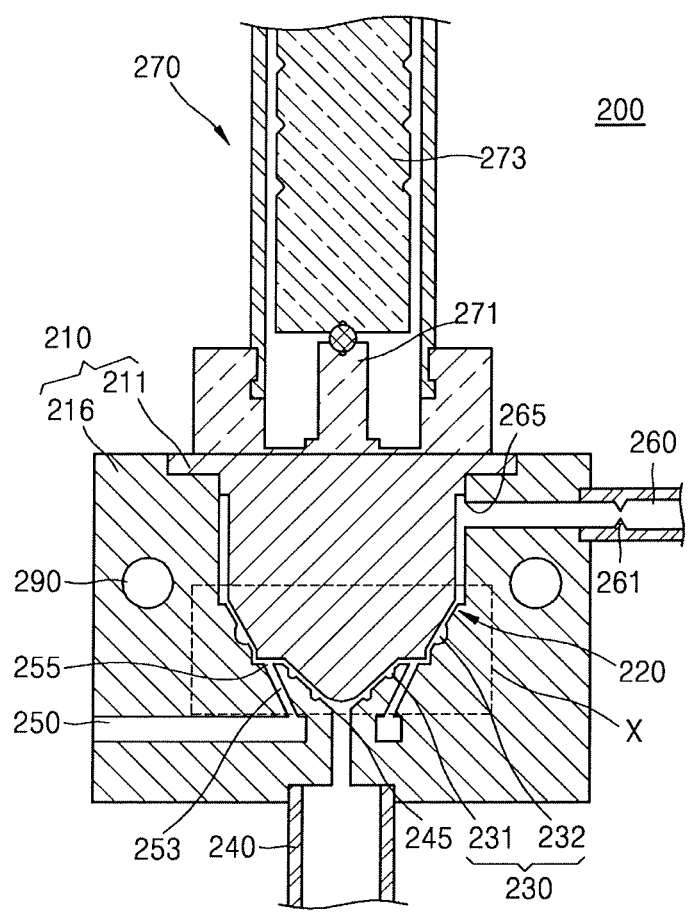
FIG. 16 is a cross-sectional view of a vaporizer according to an exemplary embodiment of the present inventive concept.
Figure 17:
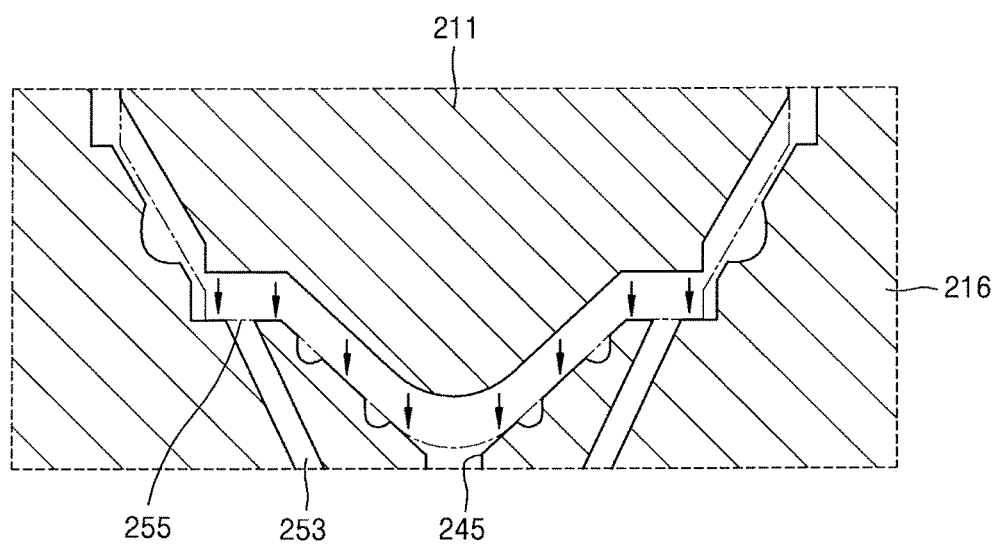
FIG. 17 is a magnified view of an area X of FIG. 16.

FIG. 16 is a cross-sectional view illustrating a vaporizer according to an exemplary embodiment of the present inventive concept. FIG. 17 is a diagram illustrating the magnification of an area X of FIG. 16.

Referring to FIG. 16, a vaporizer 200 may include a main body 210, a valve unit 270, a carrier gas injection path 240, a source material injection path 250, and a discharge path 260. The main body 210 may include a first body 211, a second body 216, and a mixing chamber 220. The carrier gas injection path 240, the source material injection path 250, and the discharge path 260 may be formed in the main body 210. The carrier gas injection path 240, the source material injection path 250, and the discharge path 260 may be formed in the second body 216.

A cartridge heater 290 for heating a fluid moving in the mixing chamber 220 may be provided in the main body 210. The cartridge heater 290 may be disposed in a hole formed in the second body 216.

The first body 211 may have an upper portion that narrows in a direction of the height of the first body 111, and the second body 216 may have a cavity, in which the upper portion of the first body 211 is disposed and which has an end portion narrowing in a direction of the depth of the cavity. An inner side surface of the second body 216 defining the cavity may have a shape corresponding to an outer side surface of the first body 211.

The mixing chamber 220 may be defined as a space formed between the first body 211 and the second body 216. The mixing chamber 220 may mix a carrier gas injected from the carrier gas injection path 240 with a liquid source material injected from the source material injection path 250. A carrier gas inlet 245 may be formed in an upper portion of the mixing chamber 220. An outlet 265 may be formed in a lower portion of the mixing chamber 220. A plurality of source material inlets 255 may be formed in a middle side portion of the mixing chamber 220. At least one spray path 253 may connect the source material injection path 250 and at least one of the source material inlets 255.

A carrier gas may be injected toward the top of the first body 211 and may move from an upper portion of the mixing chamber 220 toward a lower portion of the mixing chamber 220. A liquid source material may be injected into a middle side portion of the mixing chamber 220 and may be mixed with the carrier gas moved from the upper portion of the mixing chamber 220. A mixed source material generated by the mixing of the carrier gas and the liquid source material may move in a lower portion of the mixing chamber 220 and be discharged through the outlet 265.

A groove 230 for rotating a carrier gas and/or a source material may be formed in an inner wall of the mixing chamber 220. The groove may include a first groove 231 and a second groove 232. The groove 230 may be substantially the same as the groove 130 described above in more detail, for example, with reference to FIGS. 9 and 13 to 15. Thus, duplicative descriptions may be omitted.

The first body 211 may be movably connected to the second body 216. The valve unit 270 may be connected to the first body 211 and may move the first body 211 upward or downward. The valve unit 270 may include a diaphragm 271 being in contact with the first body 211 and an actuator 273 applying a pressure to the diaphragm 271 to transform the diaphragm 271. The valve unit 270 may be configured to control a carrier gas and a source material at substantially the same time.

An orifice portion 261 may be provided in the discharge path 260. The orifice portion 261 may diffuse a source material, which passes through a relatively narrow passage, to a relatively wide passage, and thus, a decompressed source material may be substantially completely vaporized. While a source material heated by a relatively high temperature passes through an orifice portion 261, the pressure of the source material may be lowered relatively rapidly. Thus, the source material may reach a substantially complete gaseous state after passing through the orifice portion 261.

Referring to FIG. 17, the valve unit 270 may move the first body 211 upward or downward to open or close the carrier gas inlet 245 and the source material inlet 255 at substantially the same time.

For example, to block a carrier gas and a source material from flowing into the mixing chamber 220, the valve unit 270 may move the first body 211 so that an upper portion of the first body 211 contacts an inner side surface of the second body 216, and thus, the upper portion of the first body 211 may close the carrier gas inlet 245 and the source material inlet 255 at substantially the same time.

To make a carrier gas and a source material flow into the mixing chamber 220, the valve unit 270 may move the first body 211 so that the upper portion of the first body 211 is spaced apart from the inner side surface of the second body 216, and thus, the carrier gas inlet 245 and the source material inlet 255 may be open.

Figure 18:
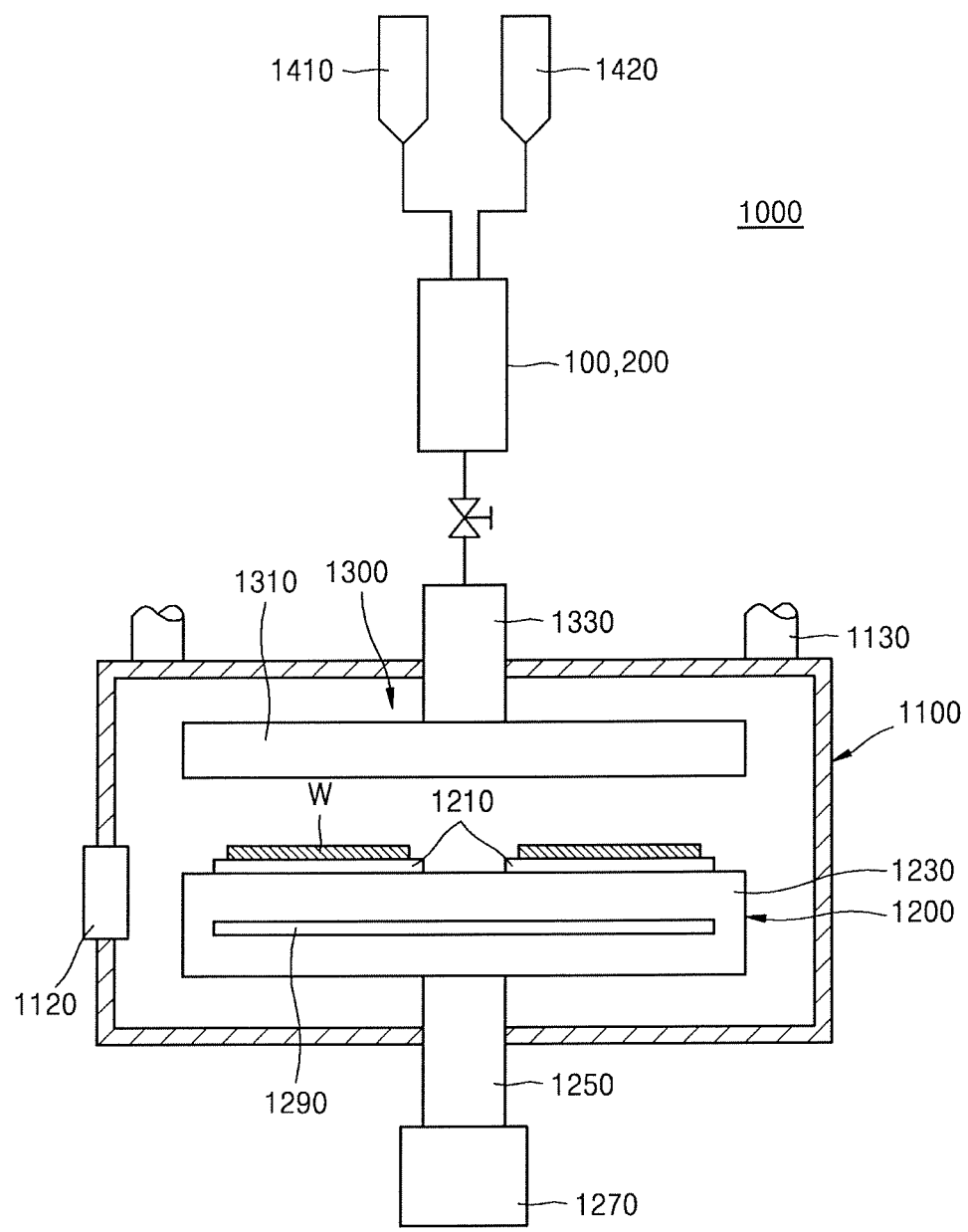
FIG. 18 is a diagram illustrating a thin film deposition apparatus according to an exemplary embodiment of the present inventive concept.

FIG. 18 is a diagram illustrating a thin film deposition apparatus according to an exemplary embodiment of the present inventive concept.

Referring to FIG. 18, a thin film deposition apparatus 1000 may include a process chamber 1100 forming a space for a deposition process and a vaporizer 100 or 200 supplying a vaporized source material to the process chamber 1100.

The vaporizer 100 or 200 and the process chamber 100 may be connected to each other via a transfer tube. The vaporizer 100 or 200 may receive a liquid source material from a source material supplier 1410 and may receive a carrier gas from a carrier gas supplier 1420. The vaporizer 100 or 200 may include the vaporizer 100 or 200 described with reference to FIGS. 1 to 17.

An input and output gate 1120 may be provided in one side of the process chamber 1100. Substrates W may be input and output through the input and output gate 1120 to perform a deposition process. The process chamber 1100 may include an exhaust air duct 1130 for exhausting a gas used in a process or a by-product of reaction. The exhaust air duct 1130 may be connected to a vacuum pump. The thin film deposition apparatus 1000 may include a pressure control valve and/or a flow control valve.

A supporting member 1200 may be disposed in an internal space of the process chamber 1100. The supporting member 1200 may be configured so that one substrate or two or more substrates may be supported by the supporting member 1200. The supporting member 1200 may include a disc-shaped table 1230 including stages 1210 and a supporting column 1250 supporting the disc-shaped table 1230. The substrates W are placed on upper surfaces of the stages 1210. The stages 1210 may be formed in a circle. When the thin film deposition apparatus 1000 is configured so that a plurality of substrates W are placed on the supporting member 1200, a plurality of stages 1210 may be formed on the disc-shaped table 1230. The plurality of stages 1210 may be arranged at regular intervals. The supporting member 1200 may be rotated by a rotation unit 1270. The disc-shaped table 1230 may internally include a heating member that is used to control the temperature of the substrates W. The supporting member 1200 may include a heater 1290.

A spraying member 1300 may spray a gas supplied from the vaporizer 100 or 200 onto each wafer W placed on the supporting member 1200. The spraying member 1300 may spray the supplied gas onto a surface of each surface W at a location corresponding to the substrate W. The spraying member 1300 may include a head 1310 that sprays a gas, and a shaft 1330 that is installed to penetrate the center of an upper portion of the process chamber 1100 and supports the head 1310. The head 1310 may have a disc shape, and gas outlets for ejecting a gas may be formed in a lower surface of the head 1310.

The vaporizer 100 or 200 may supply a gas, which is used for a deposition process, at a substantially uniform concentration, and thus, the thin film deposition apparatus 1000 according to an exemplary embodiment of the present inventive concept may accurately manufacture an electronic product having a fine line width. During a semiconductor manufacturing process, the vaporizer 100 or 200 may supply a gas having a substantially uniform concentration to the process chamber 1100, and thus, a capacitor in which the size of an upper surface and the size of a lower surface are substantially uniform may be manufactured to increase capacitance of the capacitor.

While the present inventive concept has been particularly shown and described with reference to exemplary embodiments thereof, it will be understood that various changes in form and details may be made therein without departing from the spirit and scope of the present inventive concept.

What is claimed is:

1. A vaporizer comprising:
   a main body comprising:
   a first body including an upper portion narrowing in a first direction;
   a second body including a cavity accommodating the upper portion of the first body and an inner surface facing the upper portion of the first body; and
   a mixing chamber between the first body and the second body, the mixing chamber including a space between the upper portion of the first body and the inner surface of the second body,
   wherein the second body comprises:
   a carrier gas injection path connected to a carrier gas inlet formed in an upper portion of the mixing chamber, wherein the carrier gas injection path carries a carrier gas;
   a source material injection path connected to a source material inlet formed in the mixing chamber, wherein the source material injection path carries a liquid source material; and
   a discharge path connected to an outlet formed in a lower portion of the mixing chamber, wherein a mixed fluid including the carrier gas and the liquid source material is discharged through the discharge path.

2. The vaporizer of claim 1, wherein a groove extending in a spiral direction is formed in the inner surface of the second body, wherein the groove rotates at least one of the carrier gas and the liquid source material in the spiral direction.

3. The vaporizer of claim 2, wherein a width of the groove gradually increases toward the lower portion of the mixing chamber.

4. The vaporizer of claim 2, wherein a groove extending in a spiral direction is formed in the upper portion of the first body,
   wherein the groove in the upper portion of the first body is formed at a position corresponding to the groove in the inner surface of the second body.

5. The vaporizer of claim 2, wherein a portion of the discharge path connected to the outlet extends in a direction that is tangential to the spiral direction of the groove in the inner surface of the second body.

6. The vaporizer of claim 1, wherein the source material inlet comprises a plurality of source material inlets,
   wherein the source material injection path comprises a plurality of spray paths respectively connected to the plurality of source material inlets.

7. The vaporizer of claim 6, wherein a groove extending in a spiral direction is formed in an inner wall of the mixing chamber,
   wherein the groove comprises:
   a first groove that rotates the carrier gas injected through the carrier gas inlet; and
   a second groove that rotates both the carrier gas and the liquid source material sprayed through the source material inlet.

8. The vaporizer of claim 7, wherein the second groove has a width and a depth greater than a width and a depth of the first groove, respectively.

9. The vaporizer of claim 1, further comprising a purge path that connects the carrier gas injection path to the source material injection path.

10. The vaporizer of claim 1, wherein the discharge path comprises an orifice portion that decompresses the mixed fluid discharged from the outlet.

11. The vaporizer of claim 1, further comprising a valve unit positioned in the source material injection path and configured to control injection of the liquid source material into the mixing chamber.

12. A vaporizer comprising:
    a main body comprising:
    a first body including an upper portion narrowing in a first direction;
    a second body including a cavity accommodating the upper portion of the first body and an inner surface facing the upper portion of the first body; and
    a mixing chamber between the first body and the second body the mixing chamber including a space between the upr portion of the first body and the inner surface of the second body; and
    a valve unit connected to the first body,
    wherein the first body is movably combined with the second body,
    wherein the second body comprises:
    a carrier gas injection path connected to a carrier gas inlet formed in an upper portion of the mixing chamber, wherein the carrier gas injection path carries a carrier gas;
    a source material injection path connected to a source material inlet formed in the mixing chamber, wherein the source material injection path carries a liquid source material; and
    a discharge path connected to an outlet formed in a lower portion of the mixing chamber, wherein a mixed fluid including the carrier gas and the liquid source material is discharged through the discharge path, and wherein the valve unit is configured to move the first body to open or close the carrier gas inlet and the source material inlet at substantially the same time.

13. The vaporizer of claim 12, wherein a groove extending in a spiral direction is formed in the inner surface of the second body, and wherein the groove rotates at least one of the carrier gas and the liquid source material in the spiral direction.

14. The vaporizer of claim 13, wherein the carrier gas inlet faces a top of the upper portion of the first body, wherein the source material inlet is positioned at a lower level than the top of the upper portion of the first body so that the liquid source material injected from the source material inlet meets a carrier gas rotating in the groove.

15. The vaporizer of claim 14, wherein the source material inlet comprises a plurality of source material inlets, wherein the source material injection path comprises a plurality of spray paths respectively connected to the plurality of source material inlets.

16. The vaporizer of claim 14, wherein the groove comprises:

a first groove that rotates the carrier gas, the first groove being formed between the carrier gas inlet and the source material inlet; and a second groove that rotates both the carrier gas and the liquid source material sprayed through the source material inlet, the second groove being spaced apart from the first groove with the source material inlet disposed between the first grove groove and the second groove.

17. The vaporizer of claim 16, wherein the second groove has a width and a depth greater than a width and a depth of the first groove, respectively.

18. The vaporizer of claim 12, wherein the cavity has an end portion narrowing toward an upper portion of the cavity, and wherein the carrier gas inlet faces the end portion of the cavity.

19. The vaporizer of claim 12, wherein the discharge path comprises an orifice portion that decompresses the mixed fluid discharged from the outlet.

20. A thin film deposition apparatus comprising:
a chamber; and
a vaporizer configured to supply a vaporized source material to the chamber,
wherein the vaporizer comprises:
a first body including an upper portion narrowing in a first direction of the first body;
a second body including a cavity accommodating the upper portion of the first body and an inner surface facing the upper portion of the first body; and
a mixing chamber between the first body and the second body, the mixing chamber including a space between the upper portion of the first body and the inner surface of the second body,
wherein the second body comprises:
a carrier gas injection path connected to a carrier gas inlet formed in an upper portion of the mixing chamber, wherein the carrier gas injection path carries a carrier gas;
a source material injection path connected to a source material inlet formed in the mixing chamber, wherein the source material injection path carries a liquid source material; and
a discharge path connected to an outlet formed in a lower portion of the mixing chamber, wherein a mixed fluid including the carrier gas and the liquid source material is discharged through the discharge path.

* * * * *